United States Patent [19]

King

[11] Patent Number: 5,184,029
[45] Date of Patent: Feb. 2, 1993

[54] DRIVER CIRCUIT FOR CIRCUIT TESTER

[75] Inventor: Philip N. King, Ft. Collins, Colo.

[73] Assignee: Hewlett-Packard Company, Palo Alto, Calif.

[21] Appl. No.: 776,108

[22] Filed: Oct. 15, 1991

[51] Int. Cl.[5] .................... H03K 3/01; H03K 19/086
[52] U.S. Cl. .................... 307/270; 307/455; 307/456; 307/473; 307/263; 324/73.1; 324/158 R
[58] Field of Search .................... 307/454–456, 307/473, 270, 263; 324/73.1, 158 R

[56] References Cited

U.S. PATENT DOCUMENTS

| | | | |
|---|---|---|---|
| 3,585,407 | 6/1971 | Vinson | 307/255 |
| 3,781,689 | 12/1973 | Marshall et al. | 328/61 |
| 3,965,468 | 6/1976 | Bronson | 340/349 |
| 4,278,918 | 7/1981 | Bachofer | 315/169.4 |
| 4,287,433 | 9/1981 | Goodspeed | 307/473 |
| 4,345,164 | 8/1982 | Gies | 307/255 |
| 4,376,900 | 3/1983 | Metzger | 307/473 |
| 4,430,585 | 2/1984 | Kirk, Jr. | 307/473 |
| 4,467,223 | 8/1984 | Neely | 307/254 |
| 4,569,059 | 2/1986 | Fish | 307/270 |
| 4,588,945 | 5/1986 | Groves et al. | 324/158 R |
| 4,631,419 | 12/1986 | Sadamatsu et al. | 307/255 |
| 4,678,943 | 7/1987 | Uragami et al. | 307/473 |
| 4,704,548 | 11/1987 | Strong et al. | 307/456 |
| 4,716,304 | 12/1987 | Fiebig et al. | 307/270 |
| 4,721,867 | 1/1988 | Headen, Jr. et al. | 307/456 |
| 4,745,308 | 5/1988 | Neely | 307/473 |
| 4,947,113 | 8/1990 | Chism et al. | 324/158 R |

OTHER PUBLICATIONS

P. Horowitz and W. Hill, "The Art of Electronics", Cambridge University Press, 80–83, (1980).

Primary Examiner—William L. Sikes
Assistant Examiner—Margaret Rose Wambach

[57] ABSTRACT

A driver circuit for use in a circuit board tester performs both functional and in-circuit tests on a given device under test (DUT). The tester provides a control signal representative of a command for the driver circuit to provide test signals to the DUT. The driver circuit incorporates two stages: a pre-driver stage and a driver stage. The pre-driver stage consists of an amplifier connected to fast switching transistors with the ability to move in and out of saturation rapidly. The amplifier receives control signals and the switching transistors provide actuation signals to the driver stage. The driver stage comprises two emitter follower transistors that operate exclusively in an unsaturated state. The driver stage provides test signals to the DUT in response to the actuation signals from the two switching transistors of the pre-driver stage. Additionally, the driver circuit may be programmed to change the output voltage amplitudes of the test signals.

15 Claims, 4 Drawing Sheets

DRIVER CIRCUIT FOR CIRCUIT TESTER

BACKGROUND OF THE INVENTION

I. Field Of The Invention

The present invention generally relates to the field of electronic circuit testing and, more particularly, to the field of in-circuit and functional testing of digital devices on electronic circuit boards.

II. Related Art

As the use and complexity of digital circuits has increased over the last decade, so also has the need to test such circuits increased in order to ensure proper operation. Basically, two types of digital circuit test techniques have been developed, namely, so-called "in-circuit" test techniques and so-called "functional" test techniques.

In functional test techniques a known digital pattern is applied to the circuit inputs, and a comparison is made of the circuit output with an expected output. The differences between the actual and expected outputs provides an indication of circuit operation. Unfortunately, this technique is only useful when it is desirable to know the overall operation of a circuit, for example, a circuit which has been assembled on a printed circuit board. Very often, it is necessary to test individual circuit elements or groups of elements which have been assembled on a printed circuit board apart from the overall circuit operation.

In the in-circuit testing techniques, testing is performed on a circuit element or elements isolated from the remainder of the circuit. In-circuit testing techniques generally involve the application of a preselected digital pattern to the input of an individual circuit element, a so-called device under test or "DUT", and a comparison of the DUT response to an expected response. Since the circuit element(s) under test typically are connected to other circuit elements, it is necessary to overdrive any digital pattern or signal which is being applied by an "upstream" circuit element or logic device. Upstream logic devices are those devices whose outputs normally drive the inputs of the DUT. An overdrive signal is a signal which is superimposed at a selected location in a circuit.

With regard to in-circuit testing, several devices have been described. U.S. Pat. No. 3,781,689 to Marshall et al., discusses a pulse generator for an in-circuit tester. The generator can produce three output states for use in an in-circuit probe. The three output states are a logic high ("1"), a logic low ("0") and a high resistance state, the so-called "three-state", or "off state". FIG. 1 is a diagrammatic representation of the three states, which can be applied to the DUT by the in-circuit probe.

U.S. Pat. No. 3,965,468 to Bronson, describes a probe for use in an in-circuit testing system where various logic patterns or signals are generated, and a flashing light indicates the particular pattern or signal being applied. While hand-held probe-type devices, or systems incorporating hand-held probes, are convenient in-circuit testing tools, they are too time consuming if many tests are required. For example, if in-circuit testing was performed on a complex printed circuit board for quality control purposes, a hand held probe approach to in-circuit testing would be too time consuming.

To perform multiple simultaneous in-circuit tests on several individual circuit elements mounted on a single printed circuit board, test devices were developed such as that disclosed in U.S. Pat. No. 4,588,945 (hereafter, "the '945 patent") to Groves et al. The test device taught by the '945 patent was especially effective in finding faults which occur most commonly during circuit board assembly, i.e. solder shorts, wrongly inserted components, damaged or marginal components, and missing components.

In such test devices a printed circuit board having circuit elements mounted thereon is in turn mounted or affixed to a so-called "bed of nails." Each nail acts as an individual probe either providing a preselected test signal to or receiving an output signal from a DUT. As described in the '945 patent, a controller module applies multiple pre-generated signal patterns to multiple DUTs through a driver module. The DUT responses are received through a sensor module and compared to expected responses. The driver module is made up of a multiplicity of identical driver circuits which generate the actual voltage signals provided to selected probes, or nails. Each circuit can provide logic high, logic low, and three-state (off).

In U.S. Pat. No. 4,998,026 (hereafter, "the '026 patent") by King (the inventor herein), a driver circuit operated with any order of three state logic. The driver circuit taught by the '026 patent was unique because the driver circuit could operate at high speed and at high/low currents with unusually accurate results when driving a DUT. However, while exhibiting excellent functionality, the driver circuit taught by the '026 patent employs complex circuitry with many parts, resulting in high costs and large space requirements.

SUMMARY OF THE INVENTION

The present invention is a novel driver circuit for use in a circuit board tester which can perform both in-circuit and functional testing on an electronic device, a so-called device under test (DUT), situated on a circuit board. The driver circuit comprises two stages connected in series: a pre-driver stage for receiving control signals and a driver stage for providing a desired test signal to the DUT, in accordance with the control signals.

The pre-driver stage has an amplifier and two switching transistors, preferably very fast gold-doped transistors. The amplifier receives the control signals from the circuit board tester and provides a switching signal to the two switching transistors. The two switching transistors can switch in and out of saturation very rapidly, to thereby turn "on" and "off". Moreover, the two switching transistors provide actuation signals to the driver stage.

The driver stage comprises two emitter follower-connected transistors having their bases connected respectively to the two switching transistors of the pre-driver stage. The two emitter follower transistors receive the actuation signals from the pre-driver stage and, in response, provide the test signals to the DUT. Unlike the two switching transistors of the pre-driver stage, the two emitter follower transistors of the driver stage switch "on" and "off" exclusively in an unsaturated condition.

In accordance with the present invention, the voltage amplitudes of the test signals from the driver circuit may be adjusted by increasing the supply voltage to the two switching transistors of the pre-driver stage. The adjustment may be performed digitally via a digital-toanalog converter (DAC). Hence, the novel driver circuit is a flexible system.

Furthermore, the present invention can perform virtually the same function as the '026 patent at a fraction of the cost by utilizing a more simplified circuit. The present invention incorporates fewer circuit elements, making the present invention more economical to manufacture and repair.

Additionally, the present invention operates at a much lower power dissipation rate than previous testing driver circuits, thereby making the driver circuit more efficient.

Finally, unlike many prior driver circuits, the present invention never saturates the output transistors which provide the test signals, thereby overcoming limits on operation bandwidth usually associated with most prior art drivers, while still providing sufficient output current to perform in-circuit overdrive testing.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE DRAWINGS

The present invention will be described with reference to the accompanying drawings.

DETAILED DESCRIPTION OF THE PREFERRED EMBODIMENTS

Figure 1:
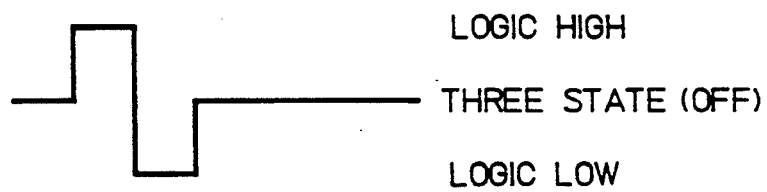
FIG. 1 is a diagrammatic representation of the three states which can be driven by a three-state driver, specifically: logic high, logic low, and off-condition ("off")
Figure 2:
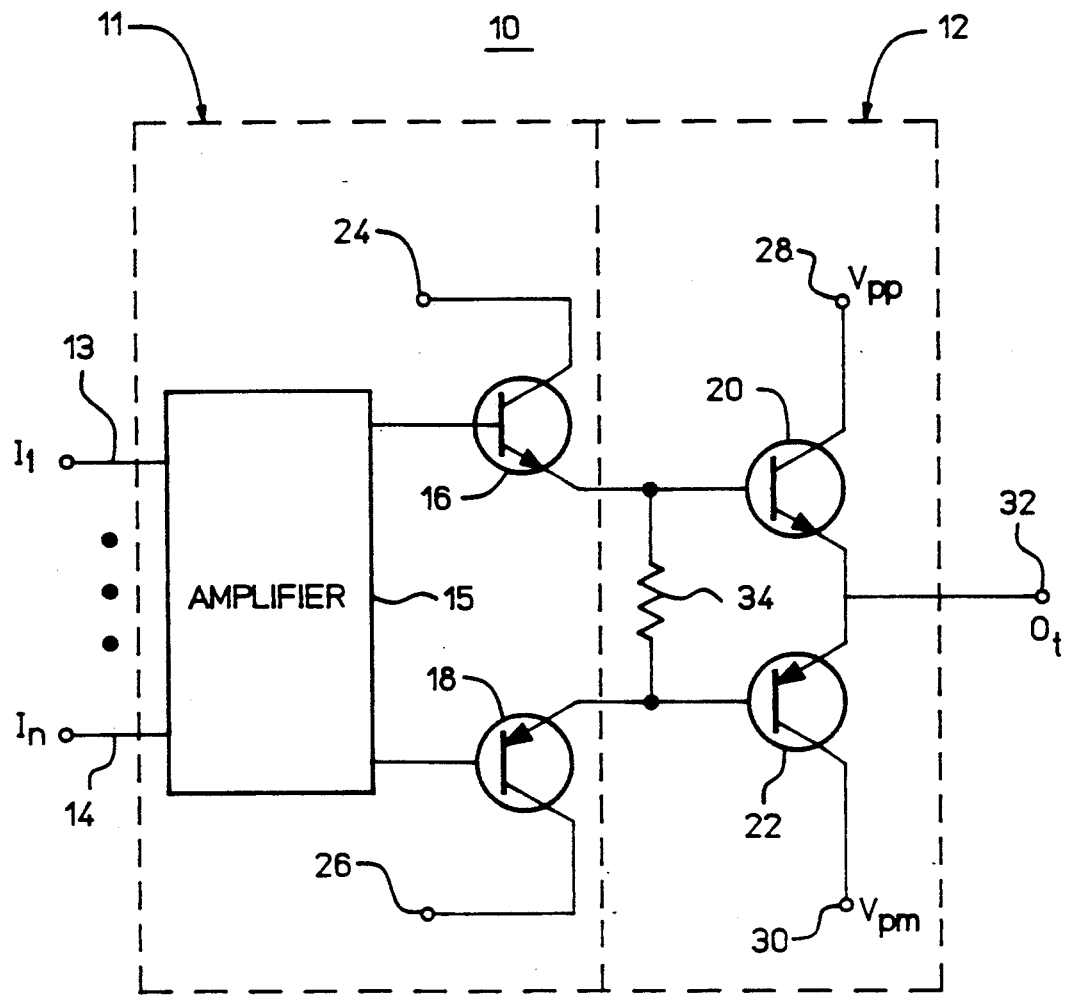
FIG. 2 illustrates a block diagram of a driver circuit according to a first embodiment of the present invention.

A first embodiment of the present invention is illustrated in FIG. 2. A three-state driver circuit 10 provides high speed and high current test signals to a DUT. The three-state driver circuit 10 includes two stages: a pre-driver stage 11 and a driver stage 12. The pre-driver stage 11 receives control signals from inputs $I_1$ through $I_n$, shown at 13 and 14, respectively, and, in turn, the driver stage 12 provides desired test signals via an output 32 to the DUT, in accordance with the control signals. An important aspect of the present invention is that the pre-driver stage 11 operates in both the saturated and unsaturated states, while the driver stage 12 always operates in only the unsaturated state. Operating in the foregoing configuration allows high current signals to be maintained at a very high rate of speed.

More specifically, in the first embodiment of FIG. 2, at least two control signals $I_1$ and $I_2$ are provided via inputs 13, 14 to an amplifier 15 of the pre-driver stage 11. In general, one signal line would specify whether the driver should be providing a logic high or a logic low level to the DUT, and the second signal would determine whether or not the driver is in the "three-state" ("off") condition. Amplifier 15 provides the gain and level shifting for the driver circuit 10. The structure and operation of the amplifier 15 are well known in the art and may be implemented using any one of a number of amplifier designs.

Figure 3:
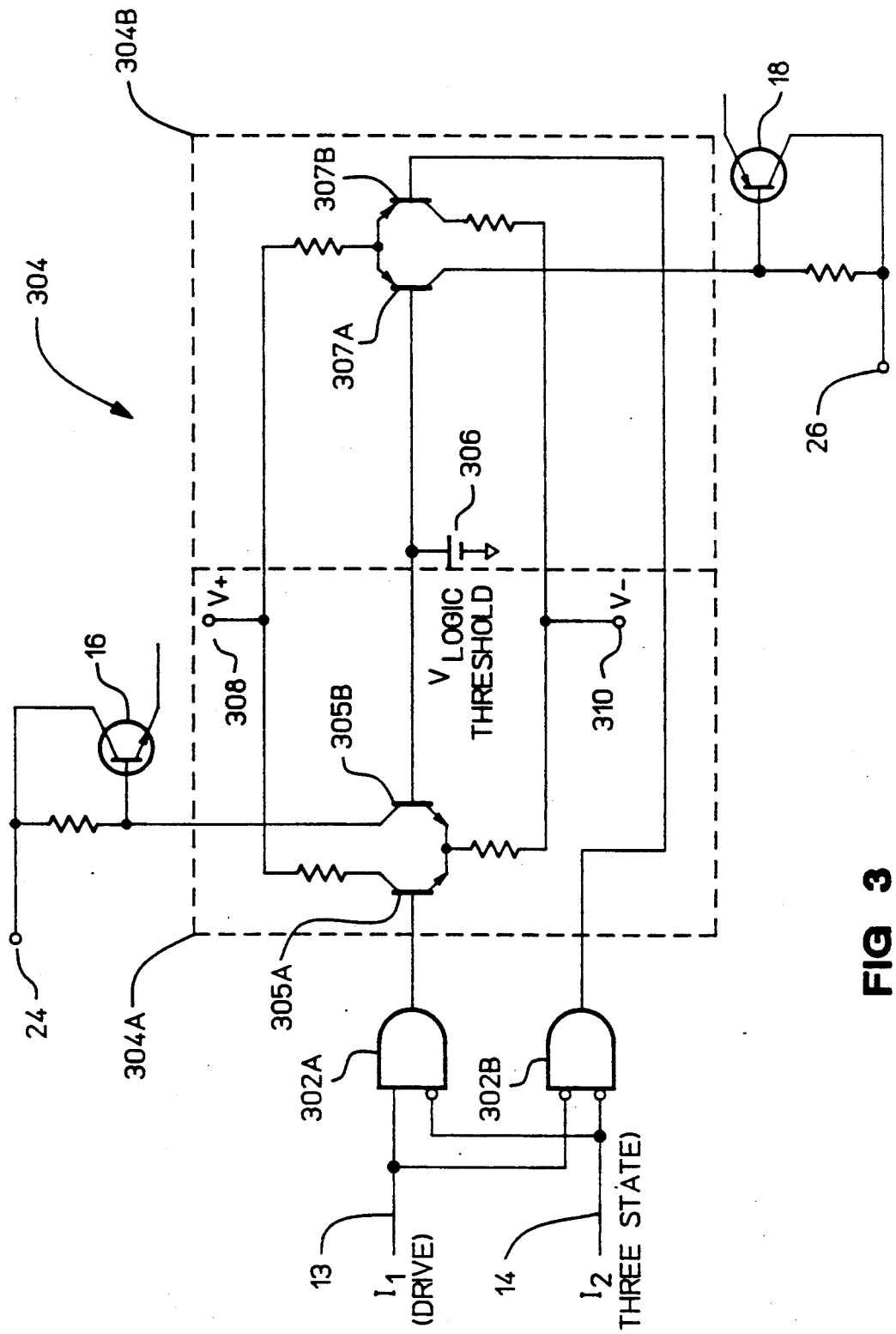
FIG. 3 illustrates an example of an amplifier that may be implemented according to the first embodiment of the present invention.

For example, the amplifier 15 may be implemented using the amplifier design shown in FIG. 3. According to this amplifier design, the amplifier 15 would include two logic gates 302, two discrete transistor differential amplifiers 304A and 304B, a $V_{LT}$ 306 (where LT=Logic Threshold), and bias voltage supplies 308 and 310.

Input 13 acts as a drive state control line and Input 14 acts as a three-state control line. A truth table provided below in Table 1 shows each driver function corresponding to each input, 13 and 14. The transistor differential amplifier 304A is coupled to the logic gate 302A. The differential amplifier 304A has two bipolar NPN transistors 305A and 307A connected as a differential amplifier. The differential amplifier 304B has two bipolar PNP transistors, 305B and 307B, connected as a second differential amplifier. The two discrete transistor differential amplifiers 304A and 305B are tied together in parallel. The $V_{LT}$ 306 is equal to a threshold for the logic gates 302. Bias voltage supplies 308 and 311 in combination with the resistors shown provide correct biasing for the transistors 305 and 307. This circuit is very well known to those skilled in the art and can be found in P. Horowitz and W. Hill, *The Art of Electronics*, Cambridge Univeristy Press, 80–83 (1980), which is incorporated herein by reference.

TABLE 1

| 13 | 14 | Driver Function |
|----|----|-----------------|
| 0  | 0  | Logic Low       |
| 0  | 1  | "Off"           |
| 1  | 0  | Logic High      |
| 1  | 1  | "Off"           |

Referring again to FIG. 2, the pre-driver stage 11 has two complementary switching transistors 16 and 18, as discussed above. Switching transistor 16 is an NPN-type transistor and switching transistor 18 is a PNP-type transistor, which types are well known in the art. Switching transistors 16 and 18 operate in and out of saturation when turning "on" and "off", respectively, thus requiring extremely fast switching time. Typically, switching transistors 16 and 18 utilize gold dopant to increase their speed. Typical examples would be switching transistor 16 as Motorola MPS2369 and switching transistor 18 as Motorola 2N5771. Other devices common in the market that would also work well are MOSFETs, JFETs, D-MOS and various other FET and bipolar devices.

Switching transistor 16 has its collector connected to a positive supply voltage at a node 24, which in the preferred embodiment will not vary as load currents vary. Known as a "stiff" voltage source, the positive supply voltage may be programmed as will be explained below in regard to FIG. 4. The collector of switching transistor 18 is also connected to a supply voltage at a node 26 and is similar to the supply voltage at node 24, except the supply voltage at the node 26 is a "stiff" negative voltage.

The pre-driver stage 11, having switching transistors 16 and 18, is connected in series with the driver stage 12, as shown. The driver stage 12 has two transistors 20 and 22, which are set up as emitter followers. More specifically, the emitter of switching transistor 16 is connected to the base of emitter follower transistor 20. Moreover, the emitter of switching transistor 18 is connected to the base of emitter follower transistor 22.

The collector of emitter follower transistor 20 is connected to a supply voltage $V_{pp}$ at node 28. Emitter follower transistor 22 has its collector connected to a supply voltage $V_{pm}$ at node 30. In a preferred embodiment, $V_{pp}$ is a supply voltage at a nominal 12 V, and $V_{pm}$ is a supply voltage at a nominal negative 10V. The emitters of transistors 20 and 22 are connected together to form the driver circuit output 32, which provides the test signals to the DUT.

A resistor 34 is provided between the bases of emitter follower transistors 20 and 22. Resistor 34 is useful when switching from either logic high or logic low to three-state (high resistance). Resistor 34 serves to speed the turn off of the transistors 20, 22 by pulling base voltages of each emitter follower transistor 20, 22 toward its respective emitter voltage.

Consider now circuit 10 during operation. Assume initially that circuit 10 is in three-state, and it is desired to drive a logic high to the DUT. In three-state, a control signal is supplied to amplifier 15 causing zero current to be applied to the bases of switching transistors 16 and 18. As a result, no actuation signal is applied by the switching transistors 16 and 18 to the bases of transistors 20 and 22. Therefore, the output 32 of the driver stage 12 exhibits high resistance, or three-state.

When it is desired to provide a logic high at output 32, appropriate control signals are provided to amplifier 15 via inputs 13, 14. The control signals result in a switching signal being applied to the base of switching transistor 16, which in turn, supplies an actuation signal to the base of emitter follower transistor 20. When the actuation signal is applied to the base of emitter follower transistor 20, the emitter follower transistor 20 turns on, and a logic high is provided at output 32. Since switching transistor 16 saturates, there will be only a very small voltage drop between its collector and emitter nodes. There will be a single base emitter voltage drop between the emitter of switching transistor 16 and the output 32 (that across transistor 20). Therefore the output voltage will be a predictable amount lower than the supply voltage 24.

When a logic low is desired at the output 32, appropriate control signals are provided to amplifier 15 via inputs 13, 14. The control signals result in a switching signal being applied to the base of switching transistor 18, which in turn, provides an actuation signal to the base of emitter follower transistor 22 in the driver stage 12. Ultimately, a logic low voltage is exhibited at the output 32, as a result of emitter follower transistor 22 being turned on.

Table 2, shown below, indicates the typical parameters for the electronic circuit elements used in the first embodiment, as well as the other embodiments to be described hereinafter. It should be emphasized that many other circuit element values could be derived by somebody with ordinary skill in the art in order to practice the present invention. All configurations for performing the methodology of the present invention are incorporated herein.

Worth noting is that, in Table 2 below, the parameters for the transistors 16, 18 which operate in and out of saturation are different than the parameters of the transistors 20, 22, which always operate outside of saturation. The time ($t_{on}$) for turning on, the time ($t_{off}$) for turning off, and gain $\beta$ are specified for the transistors 16 and 18. In contrast, the speed (frequency $f_t$) and gain $\beta$ corresponding with the applicable current range are specified for transistors 20 and 22. Since transistors 20 and 22 operate well within the linear region (outside of saturation-with a collector-emitter voltage in excess of 2 volts) they will switch on and off very quickly whether or not they are gold doped types.

TABLE 2

| Circuit Element Parameters | |
|---|---|
| Transistor 16 | $t_{on} < 12$ nanoseconds |
| | $t_{off} < 18$ nanoseconds |
| | $\beta = 40$–120 at 10 milliamperes |
| Transistor 18 | $t_{on} < 15$ nanoseconds |
| | $t_{off} < 20$ nanoseconds |
| | $\beta = 50$–120 at 10 milliamperes |
| Transistor 20 | $f_t = 250$ Megahertz |
| | $\beta = 100$–300; $I_c = 150$ mA (low current) |
| | $\beta > 40$; $I_c = 500$ mA (high current) |
| Transistor 22 | $f_t = 200$ Megahertz |
| | $\beta = 100$–300; $I_c = 150$ mA (low current) |
| | $\beta > 20$; $I_c = 500$ mA (high current) |
| Resistor 34 | 25–200 Ohms ($\Omega$); preferably, approx. 50 $\Omega$ |
| Resistor 36 | 200–10,000 Ohms; preferably, approx. 1 K$\Omega$ |
| Resistor 38 | 200–10,000 Ohms; preferably, approx. 1 K$\Omega$ |

The present invention has the characteristic to operate at either high or low currents as well as high or low voltages depending on the DUT. Normal operating currents range from 0–700 milliamperes during operation. The optimum operating speed for a driver circuit in accordance with the present invention covers the range from DC to over 20 MHz with the typical device parameters given in the table above. The use of faster transistors would allow a wider range of operating frequency; however it should be noted that in-circuit overdrive testing is generally impractical at frequencies above about 10 MHz due to present day fixturing technology, and thus higher speed operation would apply mostly to functional testing.

Figure 4:
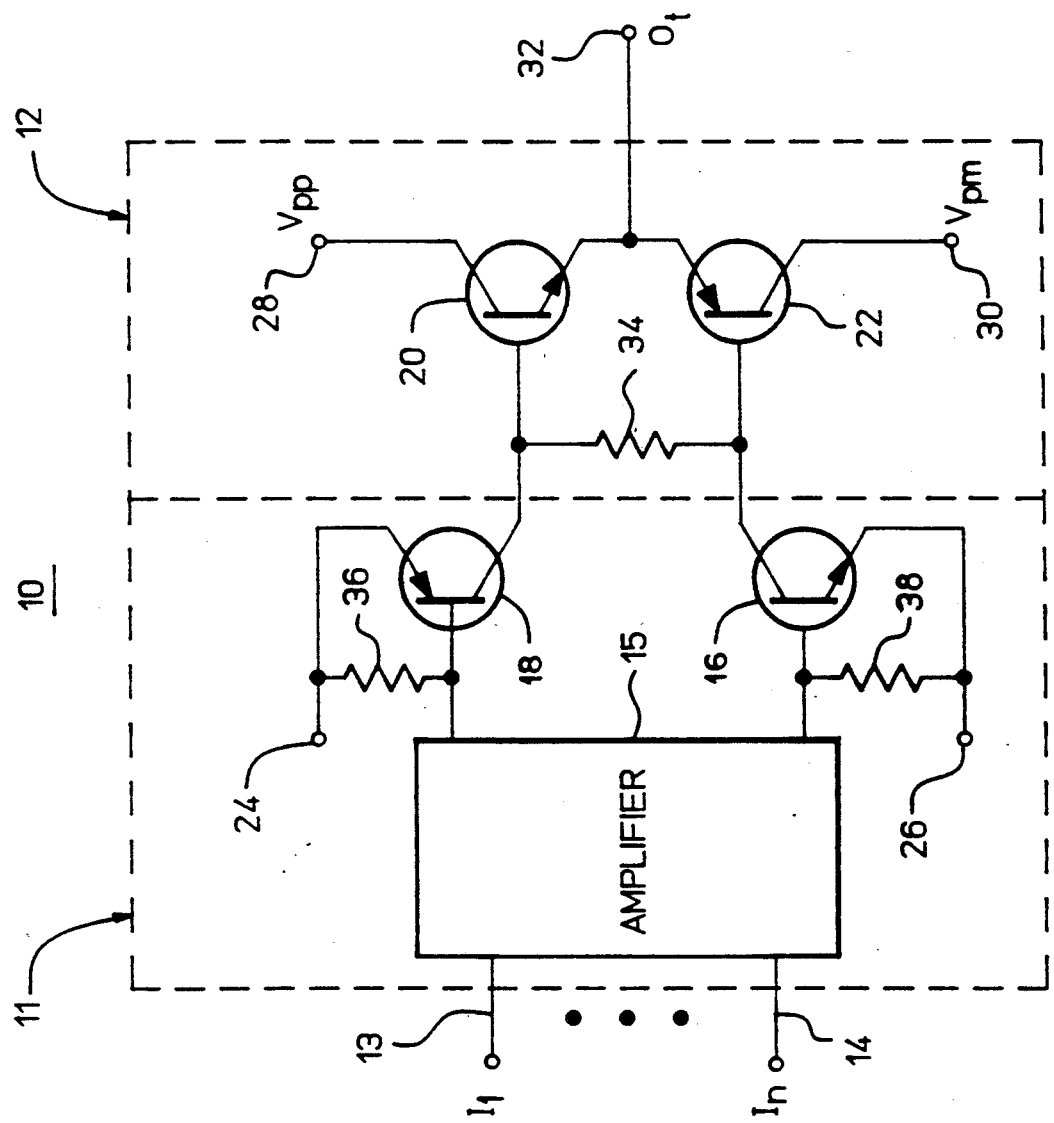
FIG. 4 illustrates a block diagram of a driver circuit according to a second embodiment of the present invention.

FIG. 4 illustrates a block diagram of a second embodiment of the present invention. In the second embodiment, the arrangement of transistors 16 and 18 has been reversed, and resistors 36 and 38 are now provided between the base and emitters of transistors 18 and 16, respectively. The second embodiment operates similar to the first embodiment. The addition of resistors 36, 38 serves to make the base/emitter voltage of respective switching transistors 18, 16 near zero when turned "off." This topology is functionally equivalent to that shown in FIG. 2; however it may make the implementation of the amplifier 15 easier in some applications.

Figure 5:
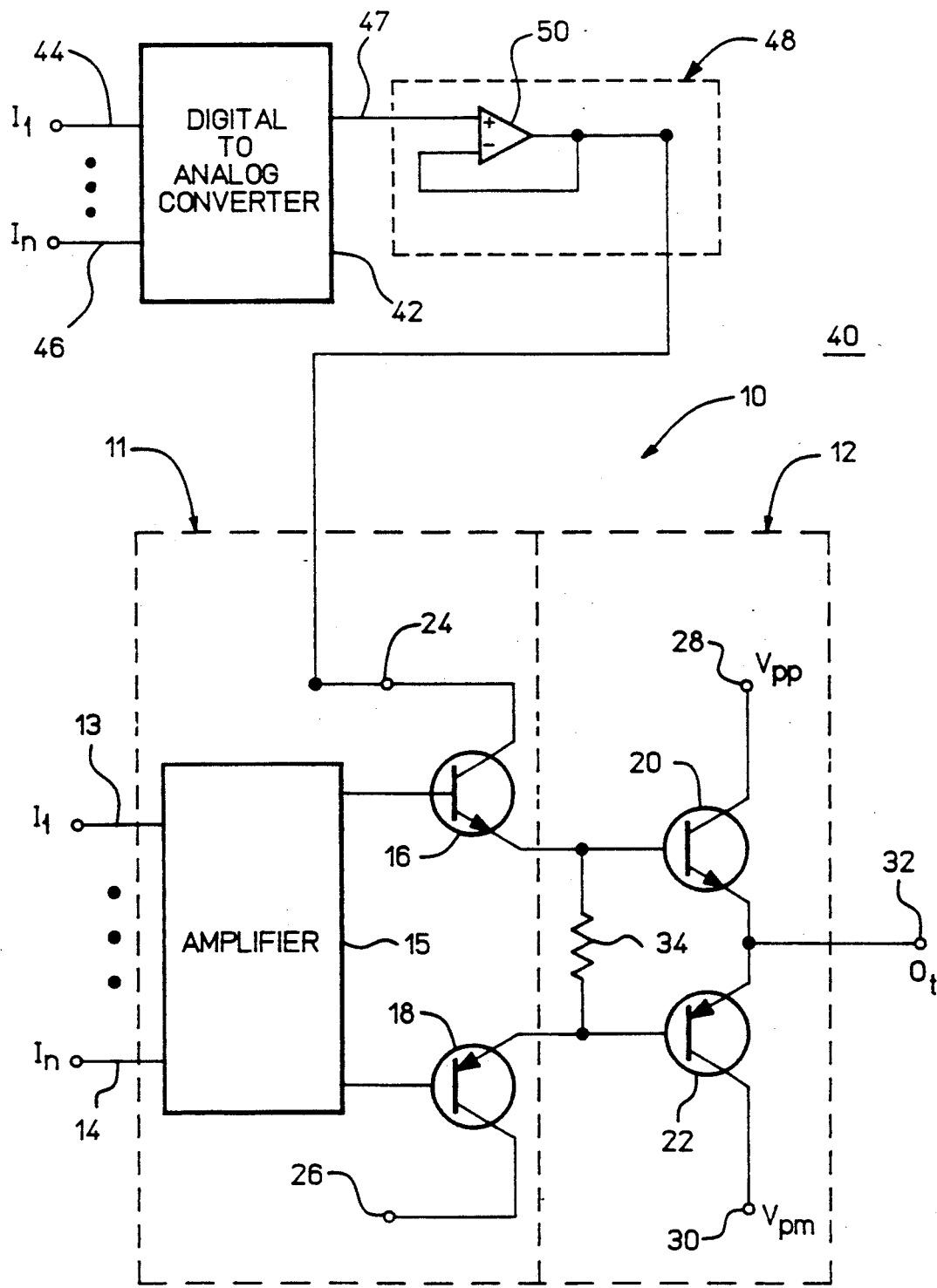
FIG. 5 illustrates a block diagram of a programmable driver circuit according to a third embodiment of the present invention.

FIG. 5 illustrates a block diagram of a third embodiment of the present invention. In FIG. 5, a driver circuit 40 comprises a means of digitally controlling the voltage amplitude at the output 32. The apparatus and methodology which will be shown and described with respect to FIG. 5 can be implemented in both the first and second embodiments.

Referring to FIG. 5, the voltage amplitude of test signals at node 32 can be controlled via the collectors of switching transistors 16, 18 at respective nodes 24, 26. In order to vary the voltage amplitude at node 32, it is necessary to change (higher or lower) the stiff voltage at collectors 24, 26. For example, a stiff voltage of 6 volts applied to collector 24 will provide a voltage amplitude of approximately 5 volts at the output 32.

FIG. 5 further shows an example of a digital programming method for adjusting the voltage amplitude for a logic high at output 32. In this programming method, a Digital-to-Analog Converter (DAC) 42 is employed to receive control signals 44, 46. An analog output 47 from the DAC 42 is fed to an amplifier 48. In the third embodiment of FIG. 4, a conventional operational amplifier 50, or equivalent thereof, is connected as a follower to the DAC output 48. The operational amplifier 50 provides the output current necessary for the voltage at node 24 to be "stiff". It should be emphasized that other amplifier configurations can be used for the amplifier 48 and are well known to those skilled in the art.

In order to adjust the voltage amplitude for a logic low at node 32, a DAC and an amplifier comparable to that shown in FIG. 4 is connected to the node 26. In this configuration, the voltage at node 26 would be lowered (or made more negative) to increase the amplitude of a logic low. It should be emphasized that other techniques well known to those skilled in the art could be used to provide adjustable "stiff" voltages at nodes 24 and 26.

While various embodiments of the present invention have been described above, it should be understood that they have been presented by way of example only, and are not intended to be limiting. Thus, the breadth and scope of the present invention should not be limited by any of the above-described exemplary embodiments, but should be defined only in accordance with the following claims and their equivalents.

The following is claimed:

1. A driver circuit for providing high-speed test-signals to an electronic device under test, the driver circuit comprising:
    a pre-driver stage with inputs and outputs, said inputs connected to control signals, said outputs comprising actuation signals, said pre-driver stage comprising an amplifier connected to first and second switching transistors, said switching transistors capable of fast switching on and off, in and out of saturation, respectively; and
    a driver stage which receives said actuation signals produced from said pre-driver stage and drives said test signals, said driver stage comprising first and second emitter follower transistors, said first emitter follower transistor coupled to said first switching transistor, said second emitter follower transistor coupled to said second switching transistor, said emitter follower transistors configured to switch on and off in a condition outside of saturation when driving said test signals.

2. The driver circuit of claim 1, wherein said switching transistors of said pre-driver stage utilize gold-doping to enhance speed.

3. The driver circuit of claim 2, further comprising a digital-to-analog converter means connected to at least one of said switching transistors, said convertor means for producing a desired output voltage amplitude of said driver stage.

4. The driver circuit of claim 1, further comprising a digital-to-analog converter means connected to at least one of said switching transistors, said convertor means for producing a desired output voltage amplitude of said driver stage.

5. The driver circuit of claim 1, wherein each of said emitter follower transistors has a base, a collector and an emitter, said driver circuit further comprising a resistor connected between the bases of said emitter follower transistors.

6. The driver circuit of claim 5, further comprising a digital-to-analog converter means connected to at least one of said switching transistors, said converter means for producing a desired output voltage amplitude of said driver stage.

7. The driver circuit of claim 5, wherein said switching transistors of said pre-driver stage utilize gold doping to enhance speed.

8. The driver circuit of claim 7, further comprising a digital-to-analog converter means connected to at least one of said switching transistors, said converter means for producing a desired output voltage amplitude of said driver stage.

9. The driver circuit of claim 1, wherein each of said test signals has a voltage amplitude, said driver circuit capable of adjusting the voltage amplitude of said test signals.

10. A driver circuit for providing high-speed test signals to an electronic device under test, the driver circuit comprising:
    driver means for providing said test signals to said electronic device in response to actuation signals wherein said driver means further comprises first and second emitter follower transistors, said first emitter follower transistor coupled to a first switching transistor, said second emitter follower transistor coupled to a second switching transistor, said emitter follower transistors configured to switch on and off in a condition outside of saturation when driving said test signals; and
    pre-driver means connected to said driver means, said pre-driver means for receiving control signals and for generating said actuation signals in response to said control signals.

11. The driver circuit of claim 10, wherein said pre-driver means comprises an amplifier connected to (two) said first and second switching transistors, said switching transistors capable of fast switching on and off, in and out of saturation respectively.

12. The driver circuit of claim 10, wherein each of said test signals has a voltage amplitude, said driver circuit capable of adjusting the voltage amplitude of said test signals.

13. A method for providing high-speed test signals to an electronic device under test in a driver circuit comprising a pre-driver stage with inputs and outputs, said inputs connected to control signals, said outputs comprising actuation signals, said pre-driver stage comprising an amplifier connected to first and second switching transistors, said driver circuit further comprising a driver stage which receives said actuation signals produced from said pre-driver stage and drives the test signals, said driver stage comprising first and second emitter follower transistors, said first emitter follower transistor coupled to said first switching transistor, said second emitter follower transistor coupled to said second switching transistor, comprising the steps of:
    providing control signals to said pre-driver stage, said control signals corresponding to a desired test signal;
    switching said first and second switching transistors on and off, in and out of saturation, respectively;
    switching said first and second emitter follower transistors on and off, outside of saturation; and
    driving said desired test signal to said electronic device under test.

14. The method of claim 13, further comprising the step of adjusting the amplitude of said desired test signal by adjusting the supply voltage to said switching transistors.

15. The method of claim 13, further comprising the steps of:

providing a digital signal corresponding to a desired amplitude of said test signal;
converting said digital signal to an analog signal;
providing said analog signal as the supply voltage to said switching transistors; and
adjusting the amplitude of said desired test signal.

* * * * *